(12) United States Patent
Aoyagi

(10) Patent No.: US 7,508,080 B2
(45) Date of Patent: Mar. 24, 2009

(54) SEMICONDUCTOR DEVICE AND METHOD OF MANUFACTURING THE SAME, CIRCUIT BOARD, AND ELECTRONIC INSTRUMENT

(75) Inventor: Akiyoshi Aoyagi, Sagamihara (JP)

(73) Assignee: Seiko Epson Corporation, Tokyo (JP)

( * ) Notice: Subject to any disclaimer, the term of this patent is extended or adjusted under 35 U.S.C. 154(b) by 293 days.

(21) Appl. No.: 10/941,871

(22) Filed: Sep. 16, 2004

(65) Prior Publication Data
US 2005/0095746 A1 May 5, 2005

(30) Foreign Application Priority Data
Sep. 24, 2003 (JP) .............................. 2003-331496

(51) Int. Cl.
*H01L 21/44* (2006.01)
(52) U.S. Cl. ...................... 257/778; 257/737
(58) Field of Classification Search .......... 257/700–799
See application file for complete search history.

(56) References Cited

U.S. PATENT DOCUMENTS 6,011,315 A * 1/2000 Toyosawa et al. ........... 257/783

6,744,122 B1 6/2004 Hashimoto

FOREIGN PATENT DOCUMENTS

| JP | A-08-102583 | 4/1996 |
|---|---|---|
| JP | 2000-277566 A | 10/2000 |
| JP | 2003-158156 A | 5/2003 |
| WO | WO 01/26147 A1 | 4/2001 |

* cited by examiner

*Primary Examiner*—Leonardo Andújar
(74) *Attorney, Agent, or Firm*—Oliff & Berridge, PLC

(57) ABSTRACT

A method of manufacturing a semiconductor device includes: forming a protective film including an opening on a wiring board having an interconnect pattern so that the protective film has an uneven surface and a part of the interconnect pattern is exposed in the opening; and mounting a semiconductor chip including an electrode on the wiring board so that the part of the interconnect pattern exposed in the opening faces and is electrically connected with the electrode. The protective film is formed so that a recess of the uneven surface does not pierce the protective film.

3 Claims, 6 Drawing Sheets

SEMICONDUCTOR DEVICE AND METHOD OF MANUFACTURING THE SAME, CIRCUIT BOARD, AND ELECTRONIC INSTRUMENT

Japanese Patent Application No. 2003-331496, filed on Sep. 24, 2003, is hereby incorporated by reference in its entirety.

BACKGROUND OF THE INVENTION

The present invention relates to a semiconductor device and a method of manufacturing the same, a circuit board, and an electronic instrument.

It is known in the art that a protective film is formed on a wiring board including an interconnect pattern in order to protect the interconnect pattern. The amount of water which evaporates from the surface of the protective film can be increased by increasing the surface area of the protective film, whereby reliability of the semiconductor device can be increased.

BRIEF SUMMARY OF THE INVENTION

A method of manufacturing a semiconductor device according to a first aspect of the present invention includes:

forming a protective film including an opening on a wiring board having an interconnect pattern so that the protective film has an uneven surface and a part of the interconnect pattern is exposed in the opening; and mounting a semiconductor chip including an electrode on the wiring board so that the part of the interconnect pattern exposed in the opening faces and is electrically connected with the electrode, wherein the protective film is formed so that a recess of the uneven surface does not pierce the protective film.

A semiconductor device according to a second aspect of the present invention is manufactured by the above method.

A semiconductor device according to a third aspect of the present invention includes:

a wiring board which includes an interconnect pattern and a protective film in which an opening is formed and which has an uneven surface, the opening exposing a part of the interconnect pattern; and a semiconductor chip which includes an electrode and is mounted on the wiring board so that the electrode faces the interconnect pattern, wherein a recess of the uneven surface is formed not to pierce the protective film.

A circuit board according to a fourth aspect of the present invention has the above semiconductor device mounted thereon.

An electronic instrument according to a fifth aspect of the present invention has the above semiconductor device.

DETAILED DESCRIPTION OF THE EMBODIMENT

Figure 1:
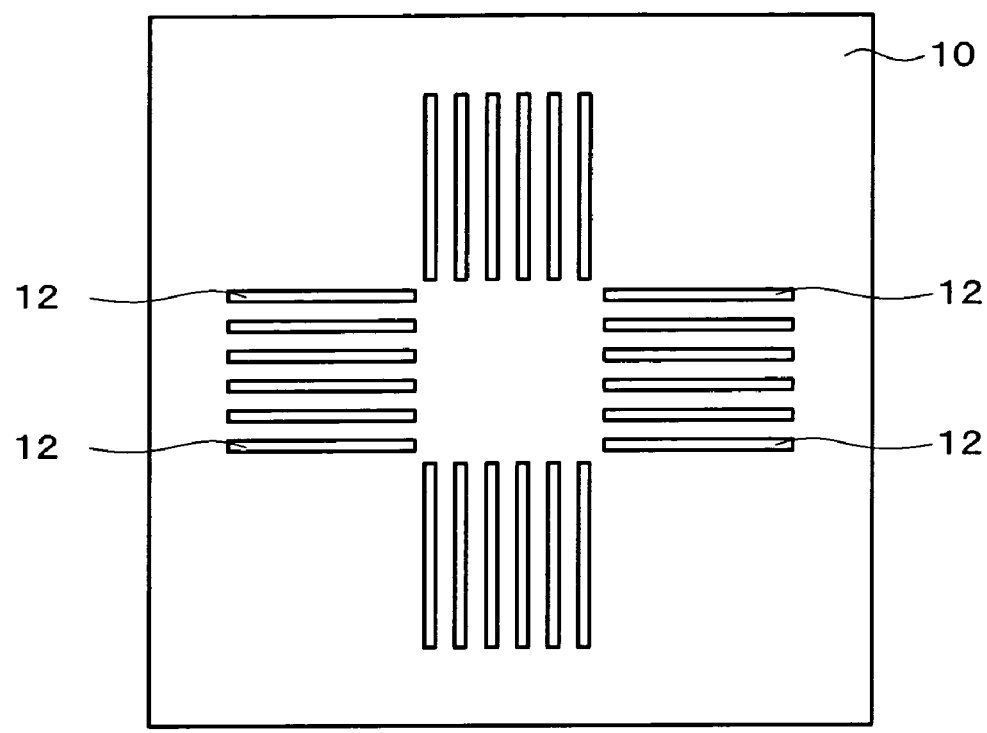
FIG. 1 is illustrative of a method of manufacturing a semiconductor device according to a first embodiment to which the present invention is applied.

Embodiments of the present invention may provide a highly reliable semiconductor device and a method of manufacturing the same, a circuit board, and an electronic instrument.

(1) A method of manufacturing a semiconductor device according to an embodiment of the present invention includes:

forming a protective film including an opening on a wiring board having an interconnect pattern so that the protective film has an uneven surface and a part of the interconnect pattern is exposed in the opening; and mounting a semiconductor chip including an electrode on the wiring board so that the part of the interconnect pattern exposed in the opening faces and is electrically connected with the electrode, wherein the protective film is formed so that a recess of the uneven surface does not pierce the protective film.

According to this embodiment of the present invention, the protective film is formed to have an uneven surface. This increases the surface area of the protective film, whereby the amount of water which evaporates from the protective film can be increased. According to this embodiment of the present invention, the recess of the uneven surface is formed not to pierce the protective film. Therefore, the interconnect pattern can be prevented from being exposed in the recess. Therefore, a highly reliable semiconductor device with excellent moisture resistance can be manufactured.

(2) This method may further include, before the step of mounting the semiconductor chip, providing an adhesive on the wiring board in a region exposed in the opening so that the adhesive extends to the protective film in a region around the opening, and the semiconductor chip and the wiring board may be bonded through the adhesive.

According to this feature, the adhesive is provided to extend to the protective film in the region around. The protective film is formed to have an uneven surface. Therefore, the contact area between the adhesive and the protective film is increased, whereby the bond strength can be increased. Therefore, the semiconductor chip and the wiring board can be caused to adhere securely, whereby a highly reliable semiconductor device can be manufactured.

(3) With this method, the adhesive may include conductive particles, and the conductive particles may be allowed to be present between the interconnect pattern and the electrode.

(4) With this method, the adhesive may be formed in a form of a paste.

(5) With this method, the adhesive may be formed in a form of a film.

(6) With this method, the protective film may be formed so that the recess includes a groove recess which is disposed to extend from an edge of the opening in the protective film to outside of a region for providing the adhesive.

According to this feature, air can be removed from the space formed by the wiring board, the protective film, and the film-shaped adhesive through the groove recess. Therefore, voids can be prevented from remaining between the semiconductor chip and the wiring board, whereby a highly reliable semiconductor device can be manufactured.

(7) With this method, the groove recess may be disposed except in a region which overlaps the interconnect pattern.

This enables manufacture of a highly reliable semiconductor device which can protect the interconnect pattern.

(8) With this method, the protective film may be formed so that a thickness of the protective film under a bottom section of the groove recess is thinner than the interconnect pattern.

According to this feature, air can be easily removed from the space formed by the wiring board, the protective film, and the film-shaped adhesive through the groove recess, whereby a highly reliable semiconductor device can be manufactured.

(9) With this method, the groove recess may be formed by pressing.

(10) With this method, the groove recess may be formed by etching.

(11) A semiconductor device according to an embodiment of the present invention is manufactured by the above method.

(12) A semiconductor device according to an embodiment of the present invention includes:

a wiring board which includes an interconnect pattern and a protective film in which an opening is formed and which has an uneven surface, the opening exposing a part of the interconnect pattern; and a semiconductor chip which includes an electrode and is mounted on the wiring board so that the electrode faces the interconnect pattern, wherein a recess of the uneven surface is formed not to pierce the protective film.

According to this embodiment of the present invention, the protective film is formed to have an uneven surface. This increases the surface area of the protective film, whereby the amount of water which evaporates from the protective film can be increased. According to this embodiment of the present invention, the recess of the uneven surface is formed not to pierce the protective film. Therefore, the interconnect pattern can be prevented from being exposed in the recess. Therefore, a highly reliable semiconductor device with excellent moisture resistance can be provided.

(13) This semiconductor device may further includes a resin section disposed between the wiring board and the semiconductor chip to extend to the protective film in a region around the opening.

According to this feature, the resin section is formed to extend to the protective film in the region around. The protective film is formed to have an uneven surface. Therefore, the contact area between the resin section and the protective film is increased, whereby the bond strength between the resin section and the protective film can be increased. Specifically, a highly reliable semiconductor device in which the wiring board and the semiconductor chip are securely bonded can be provided.

(14) A circuit board according to an embodiment of the present invention has the above semiconductor device mounted thereon.

(15) An electronic instrument according to an embodiment of the present invention has the above semiconductor device.

The embodiments of the present invention are described below with reference to the drawings. However, the present invention is not limited to the following embodiments.

First Embodiment

FIGS. 1 to 6 are illustrative of a method of manufacturing a semiconductor device according to the first embodiment to which the present invention is applied.

The method of manufacturing a semiconductor device according to this embodiment includes providing a wiring board 10 as shown in FIG. 1. The material for the wiring board 10 is not particularly limited. The wiring board 10 may be formed of an organic material (epoxy substrate, for example), an inorganic material (ceramic substrate or glass substrate, for example), or a composite structure of these materials (glass epoxy substrate). The wiring board 10 may be a rigid substrate. In this case, the wiring board 10 may be called an interposer. The wiring board 10 may be a flexible substrate such as a polyester substrate or a polyimide substrate. The wiring board 10 may be a chip on film (COF) substrate or a tape automated bonding (TAB) substrate. The wiring board 10 may be a single-layer substrate consisting of a single layer or a multi-layer substrate consisting of a plurality of stacked layers. The shape and the thickness of the wiring board 10 are not particularly limited.

As shown in FIG. 1, the wiring board 10 includes an interconnect pattern 12. The interconnect pattern 12 may be formed on each surface of the wiring board 10. In this case, one surface of the wiring board 10 may be electrically connected with the other surface through a through-hole conductive section 15 (see FIG. 3). In the case of providing a multi-layer substrate as the wiring board 10, an interconnect pattern may be formed between each layer. The interconnect pattern 12 may be formed by stacking layers of one of copper (Cu), chromium (Cr), titanium (Ti), nickel (Ni), titanium tungsten (Ti-W), gold (Au), aluminum (Al), nickel vanadium (NiV), and tungsten (W), or formed by a single layer of one of these metals. The formation method for the interconnect pattern 12 is not particularly limited. For example, the interconnect pattern 12 may be formed by sputtering or the like, or by applying an additive method in which the interconnect pattern 12 is formed by electroless plating. The interconnect pattern 12 may be formed by etching metal foil. The interconnect pattern 12 may be plated with solder, tin, gold, nickel, or the like.

Figure 2:
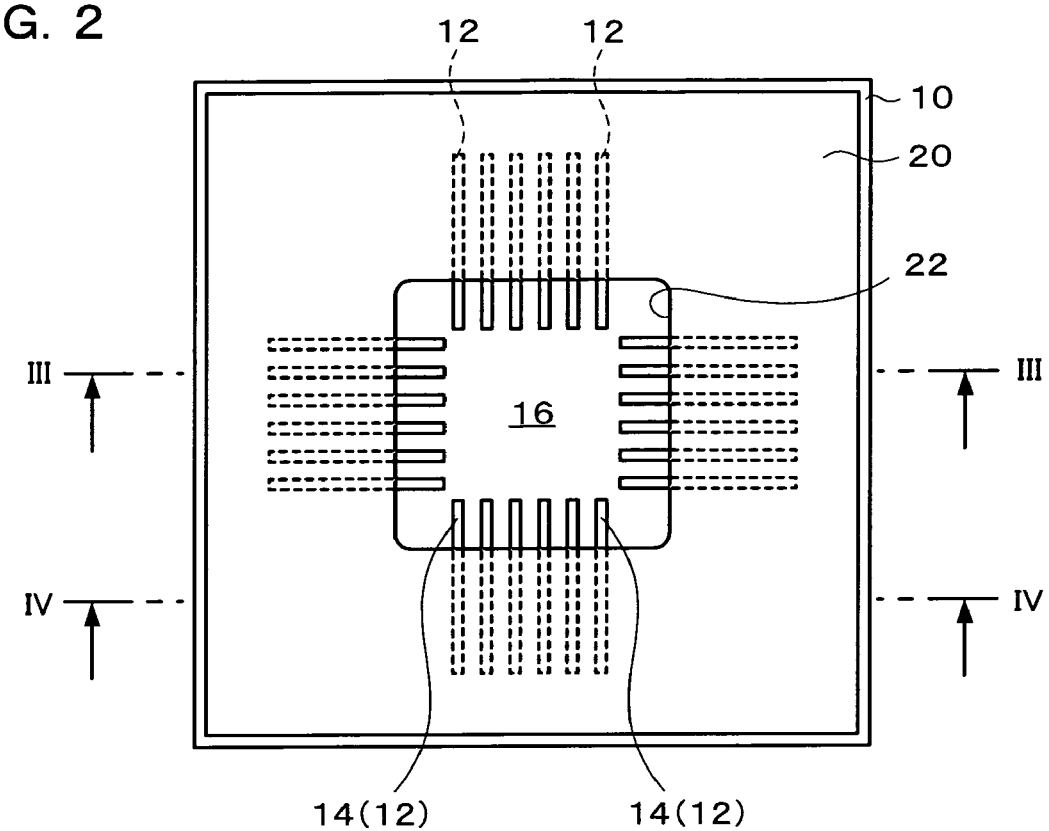
FIG. 2 is further illustrative of the method of manufacturing a semiconductor device according to the first embodiment to which the present invention is applied.
Figure 3:
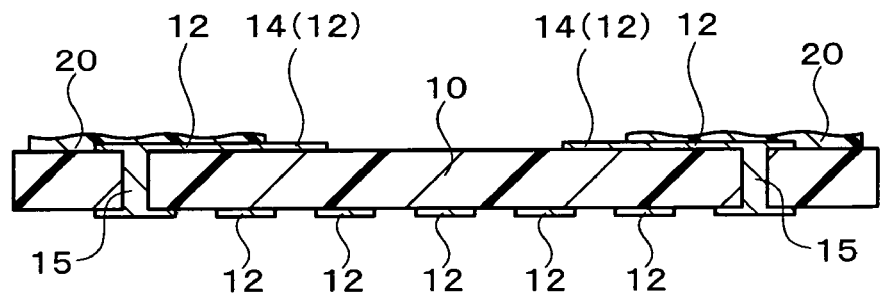
FIG. 3 is further illustrative of the method of manufacturing a semiconductor device according to the first embodiment to which the present invention is applied.
Figure 4:
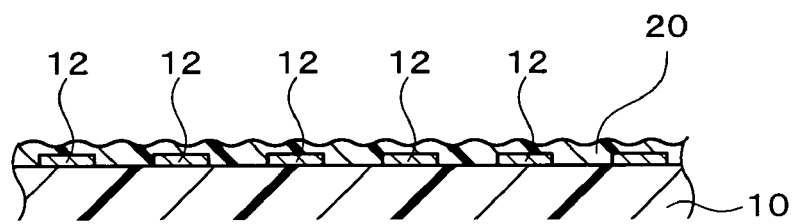
FIG. 4 is further illustrative of the method of manufacturing a semiconductor device according to the first embodiment to which the present invention is applied.

The method of manufacturing a semiconductor device according to this embodiment includes forming a protective film 20 including an opening 22 on the wiring board 10 as shown in FIGS. 2 to 4. FIG. 3 is a cross-sectional view along the line III-III shown in FIG. 2, and FIG. 4 is a partially enlarged view of the cross section along the line IV-IV shown in FIG. 2. The protective film 20 may be called a resist film. Since corrosion of the interconnect pattern 12 or short circuits between the interconnect patterns 12 can be prevented by the protective film 20, a highly reliable semiconductor device can be manufactured. The protective film 20 may be formed by using any conventional method. For example, the protective film 20 including the opening 22 may be formed by forming the protective film 20 over the entire surface of the wiring board 10 using a photosensitive material, and removing a part of the protective film 20 by an exposure and development step (lithographic step). The protective film 20 including the opening 22 may be formed by screen printing. As shown in FIG. 2, the protective film 20 is formed so that a part of the interconnect pattern 12 is exposed in the opening 22. A section of the interconnect pattern 12 exposed in the opening 22 (exposed section 14) is a section for achieving electrical conduction between a semiconductor chip 30 described later and the interconnect pattern 12.

In the method of manufacturing a semiconductor device according to this embodiment, the protective film 20 is formed to have an uneven surface as shown in FIGS. 3 and 4. For example, after forming the protective film 20, the surface of the protective film 20 may be made uneven by mechanically coarsening the surface by sandblasting, physically coarsening the surface using plasma, ultraviolet rays, ozone, or the like, or chemically coarsening the surface using an etching material. The protective film 20 may be formed to have an uneven surface by providing a precursor for the protective film 20 on the wiring board 10, making the surface of the precursor uneven, and polymerizing the precursor. The surface area of the protective film 20 can be increased by making the surface of the protective film 20 uneven. Therefore, water contained in the protective film 20 easily evaporates from the protective film 20. Moreover, since water contained in the wiring board 10 easily permeates the protective film 20, water can be easily removed from the wiring board 10. This reduces the amount of water contained in the wiring board 10 and the protective film 20, whereby a highly reliable semiconductor device can be manufactured. In the method of manufacturing a semiconductor device according to this embodiment, the protective film 20 is formed so that the recess of the uneven surface does not pierce the protective film 20. According to this feature, since the interconnect pattern 12 can be prevented from being exposed in the recess of the uneven surface, a highly reliable semiconductor device can be manufactured without strictly controlling the position of the recess of the uneven surface.

Figure 5A:
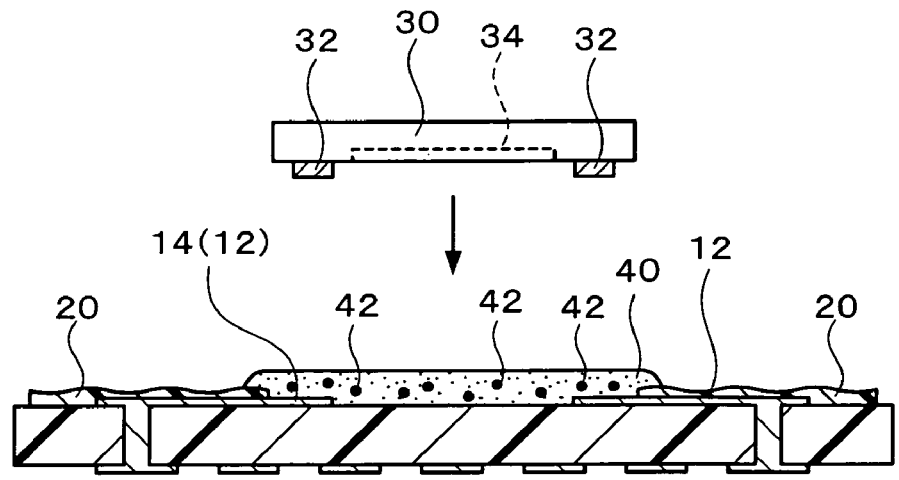
FIGS. 5A and 5B are further illustrative of the method of manufacturing a semiconductor device according to the first embodiment to which the present invention is applied.
Figure 5B:
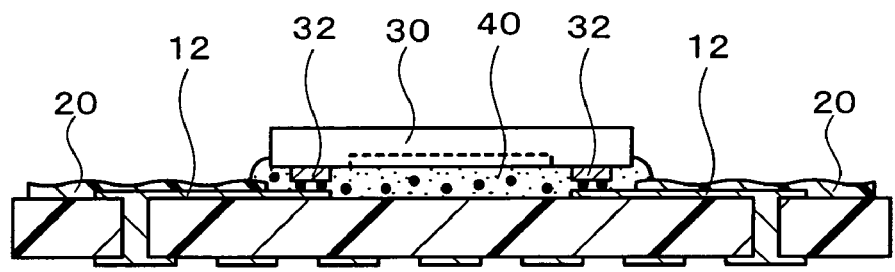

The method of manufacturing a semiconductor device according to this embodiment includes mounting the semiconductor chip 30 including an electrode 32 on the wiring board 10 (see FIGS. 5A and 5B). The electrode 32 may be electrically connected with the inside of the semiconductor chip 30. The semiconductor chip 30 may include an integrated circuit 34 which includes a transistor, a memory device, and the like. In this embodiment, as shown in FIG. 5B, the exposed section 14 of the interconnect pattern 12 exposed in the opening 22 faces and is electrically connected with the electrode 32. An adhesive 40 may be provided on the wiring board 10 before the step of mounting the semiconductor chip 30. In other words, the semiconductor chip 30 may be mounted on the wiring board 10 after providing the adhesive 40 on the wiring board 10 as shown in FIG. 5B. The adhesive 40 may be provided in the form of a paste as shown in FIG. 5A. Or, the adhesive 40 may be provided in the form of a film (not shown). The semiconductor chip 30 and the wiring board 10 may be bonded through the adhesive 40. For example, the semiconductor chip 30 and the wiring board 10 may be bonded by forming a resin section 41 by curing the adhesive 40 (see FIG. 6).

The adhesive 40 may be provided on the wiring board 10 in a region 16 exposed in the opening 22 (see FIG. 2) so that the adhesive 40 extends to the protective film 20 in the region around 22. This enables the adhesive 40 and the protective film 20 to come in contact with each other. The protective film 20 has an uneven surface as described above. Therefore, since the bond strength between the adhesive 40 and the protective film 20 can be increased by providing the adhesive 40 to extend to the protective film 20, a highly reliable semiconductor device can be manufactured. Moreover, since the contact area between the adhesive 40 and the protective film 20 can be increased, water contained in the adhesive 40 easily moves to the protective film 20. This reduces the amount of water contained in the adhesive 40 (resin section 41), whereby a highly reliable semiconductor device can be manufactured. However, the adhesive 40 may be provided in advance to extend to the protective film 20 in the region around 22 as shown in FIG. 5A. The adhesive 40 may be provided to extend to the protective film 20 in the region around 22 by being spread by the semiconductor chip 30.

As shown in FIGS. 5A and 5B, anisotropic conductive paste (or anisotropic conductive film) containing conductive particles 42 may be used as the adhesive 40. As shown in FIG. 5B, the electrode 32 and the interconnect pattern 12 may be electrically connected by allowing the conductive particles 42 to be present between the electrode 32 and the interconnect pattern 12 (exposed section 14 in more detail). This enables a semiconductor device with high electrical connection reliability to be manufactured. However, the electrode 32 and the interconnect pattern 12 may be electrically connected by causing the electrode 32 and the interconnect pattern 12 to come in contact with each other (not shown). The electrode 32 and the interconnect pattern 12 may be electrically connected by forming an alloy between the electrode 32 and the interconnect pattern 12. A semiconductor device may be manufactured by filling the space between the semiconductor chip and the wiring board with an underfill material after mounting the semiconductor chip on the wiring board (not shown). In this case, the underfill material may be provided to extend to the edge of the opening in the protective film.

As shown in FIGS. 5A and 5B, a semiconductor device may be manufactured by mounting one semiconductor chip 30 on one wiring board 10. However, a semiconductor device may be manufactured by mounting a plurality of semiconductor chips on one wiring board 10 and cutting the wiring board 10 in the subsequent step (not shown).

Figure 6:
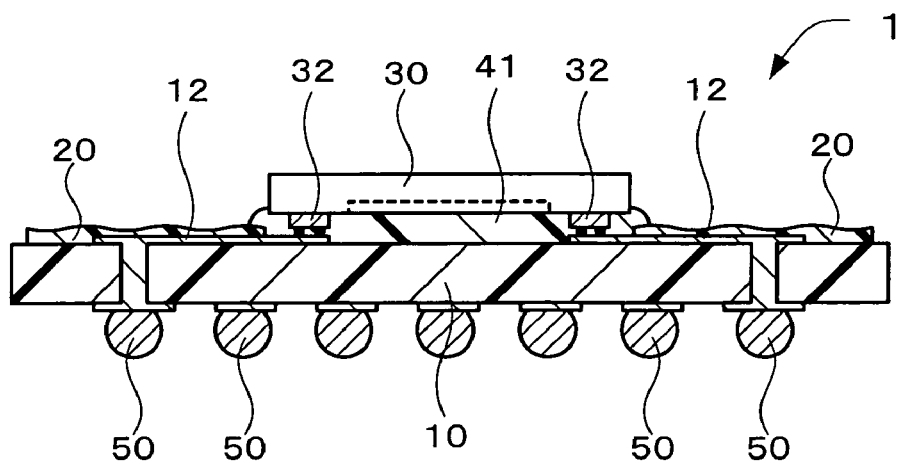
FIG. 6 is further illustrative of the method of manufacturing a semiconductor device according to the first embodiment to which the present invention is applied.

The method of manufacturing a semiconductor device according to this embodiment may further include a step of forming an external terminal 50 on the wiring board 10 (see FIG. 6). The external terminal 50 may be formed on the surface of the wiring board 10 opposite to the surface on which the semiconductor chip 30 is mounted. The external terminal 50 may be formed by using solder, for example. If necessary, a semiconductor device 1 shown in FIG. 6 may be manufactured by performing a step of cutting the wiring board 10, an inspection step, and the like.

Figure 7:
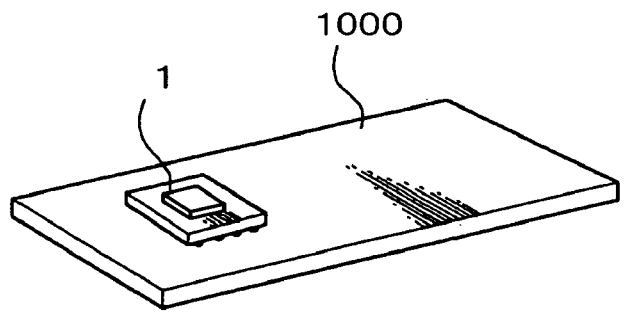
FIG. 7 shows a circuit board on which a semiconductor device according to an embodiment to which the present invention is applied is mounted.
Figure 8:
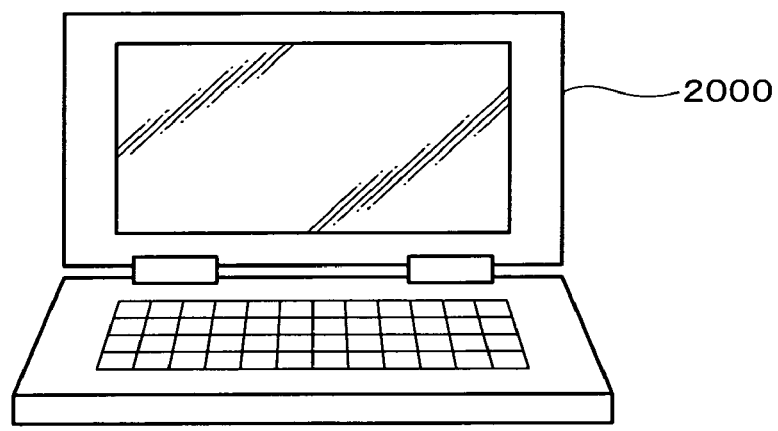
FIG. 8 shows an electronic instrument including a semiconductor device according to an embodiment to which the present invention is applied.
Figure 9:
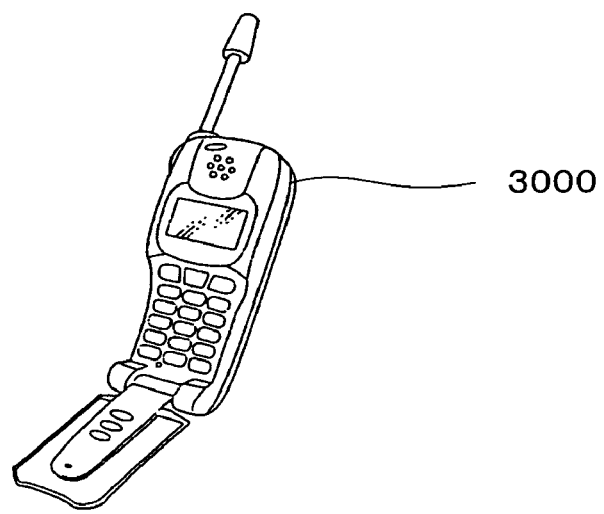
FIG. 9 shows another electronic instrument including a semiconductor device according to an embodiment to which the present invention is applied.

The semiconductor device 1 according to the first embodiment to which the present invention is applied includes the wiring board 10. The wiring board 10 includes the interconnect pattern 12. The wiring board 10 includes the protective film 20 having an uneven surface. The opening 22 which exposes a part of the interconnect pattern 12 is formed in the protective film 20. The semiconductor device 1 includes the semiconductor chip 30. The semiconductor chip 30 includes the electrode 32. The semiconductor chip 30 is mounted on the wiring board 10 so that the electrode 32 faces the interconnect pattern 12. The recess of the uneven surface of the protective film 20 is formed not to pierce the protective film 20. As described above, the protective film 20 of the semiconductor device 1 is formed to have an uneven surface. According to this feature, since the surface area of the protective film 20 is increased, the amount of water which evaporates from the protective film 20 can be increased. The recess which makes up the uneven surface of the protective film 20 is formed not to pierce the protective film 20. Therefore, the interconnect pattern 12 can be prevented from being exposed in the recess. Therefore, a highly reliable semiconductor device with excellent moisture resistance can be provided. The semiconductor device 1 may further include the resin section 41. The resin section 41 may be disposed between the wiring board 10 and the semiconductor chip 30 to extend to the protective film 20 in the region around 22. The semiconductor device 1 according to the embodiment to which the present invention is applied may further include a configuration derived from the description of the above-described method of manufacturing the semiconductor device 1. FIG. 7 shows a circuit board 1000 on which the semiconductor device 1 is mounted. FIGS. 8 and 9 respectively show a notebook-type personal computer 2000 and a portable telephone 3000 as electronic instruments including a semiconductor device according to an embodiment to which the present invention is applied.

Second Embodiment

FIGS. 10 to 15 are illustrative of a method of manufacturing a semiconductor device according to the second embodiment to which the present invention is applied. The above description shall apply to this embodiment.

Figure 10:
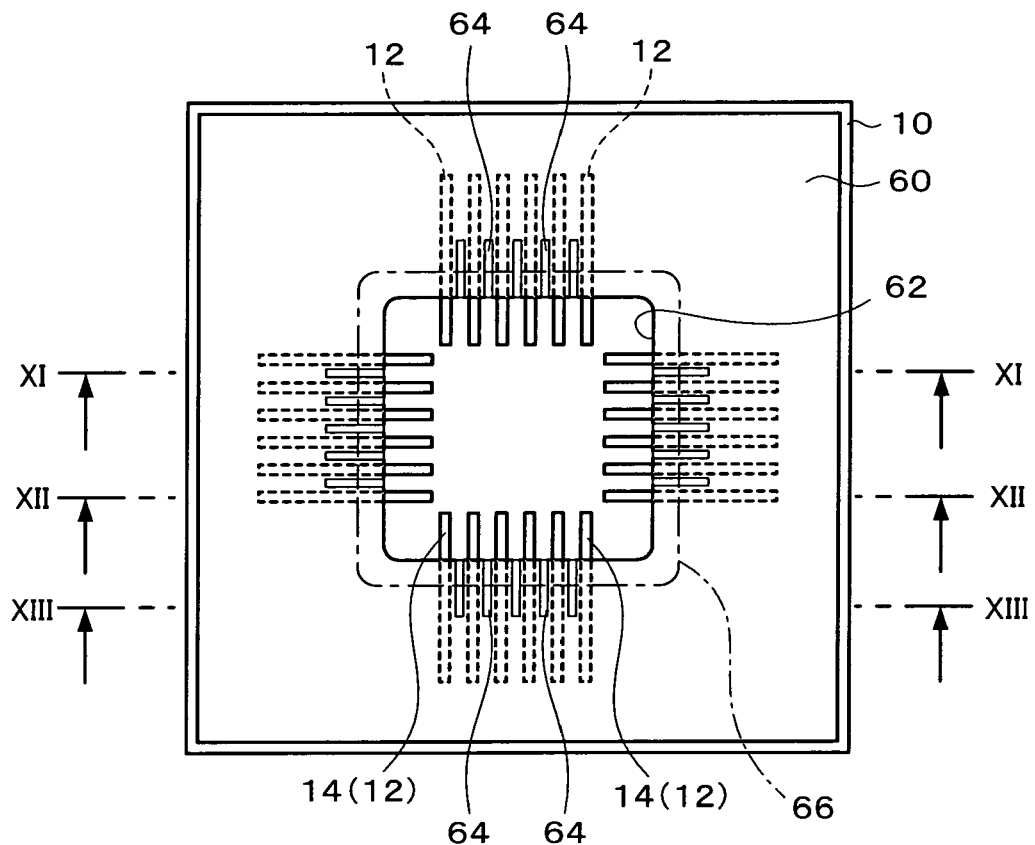
FIG. 10 is illustrative of a method of manufacturing a semiconductor device according to a second embodiment to which the present invention is applied.
Figure 11:
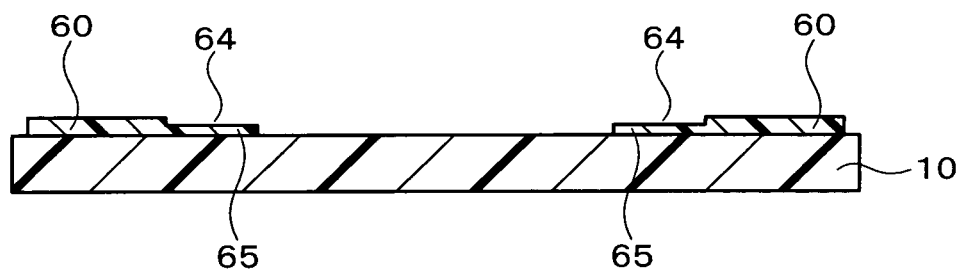
FIG. 11 is further illustrative of the method of manufacturing a semiconductor device according to the second embodiment to which the present invention is applied.
Figure 12:
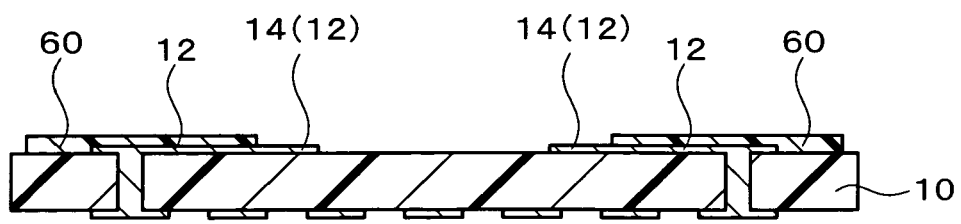
FIG. 12 is further illustrative of the method of manufacturing a semiconductor device according to the second embodiment to which the present invention is applied.
Figure 13:
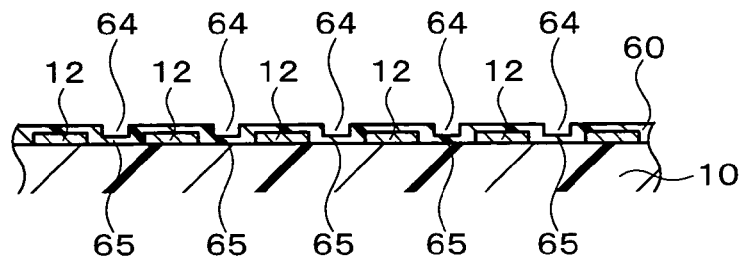
FIG. 13 is further illustrative of the method of manufacturing a semiconductor device according to the second embodiment to which the present invention is applied.

A method of manufacturing a semiconductor device according to this embodiment includes forming a protective film 60 including an opening 62 on the wiring board 10. FIGS. 10 to 13 are illustrative of a method for forming the protective film 60 on the wiring board 10. FIG. 11 is a cross-sectional view along the line XI-XI shown in FIG. 10. FIG. 12 is a cross-sectional view along the line XII-XII shown in FIG. 10, and FIG. 13 is a cross-sectional view along the line XIII-XIII shown in FIG. 13.

The method of manufacturing a semiconductor device according to this embodiment includes forming the protective film 60 to have an uneven surface. In this case, the protective film 60 is formed so that the recess of the uneven surface includes a groove recess 64 (see FIGS. 10 to 13). The formation method for the groove recess 64 is not particularly limited. For example, the protective film 60 including the opening 62 may be formed on the wiring board 10, and the groove recess 64 may be formed in the protective film 60. In more detail, the groove recess 64 may be formed by providing a precursor for the protective film 60 on the wiring board 10, formingg the opening 62 in the precursor, and polymerizing the precursor. In this case, the groove recess 64 may be formed by pressing. Or, the groove recess 64 may be formed by providing a precursor for the protective film 60 on the wiring board 10, forming the groove recess 64 in the surface of the precursor, and polymerizing the precursor. In this case, the groove recess 64 may be formed in the precursor for the protective film 60 by removing a part of the protective film 60 by etching, or the groove recess 64 may be formed by pressing. As shown in FIGS. 10 and 11, the groove recess 64 is formed to extend to the outside of a region 66 for providing an adhesive from the edge of the opening 62 in the protective film 60. As shown in FIG. 10, the region 66 for providing an adhesive is a region larger than the opening 62. The groove recess 64 may be formed except in a region which overlaps the interconnect pattern 12 (see FIGS. 10 to 13). This enables the thickness of the protective film 60 to be sufficiently secured on the interconnect pattern 12 as shown in FIGS. 12 and 13, whereby a highly reliable semiconductor device can be manufactured. In this case, the groove recess 64 may be formed along the interconnect pattern 12 (see FIG. 10). As shown in FIG. 13, the protective film 60 may be formed so that a bottom section 65 of the groove recess 64 is thinner than the interconnect pattern 12.

Figure 14:
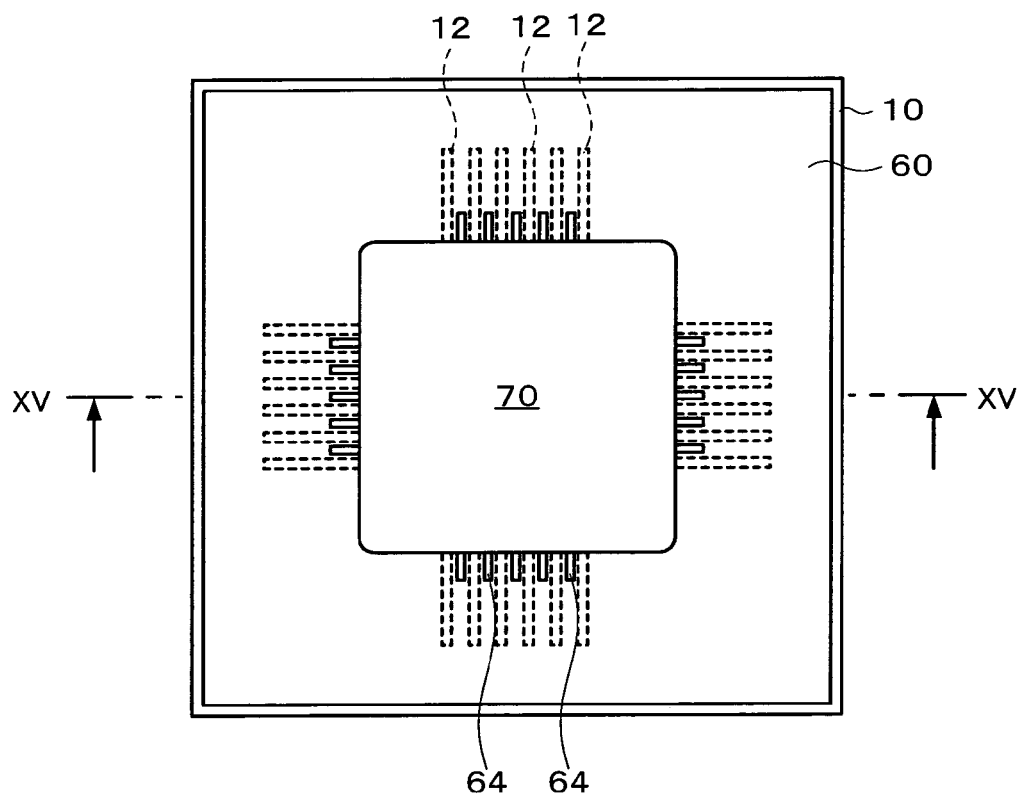
FIG. 14 is further illustrative of the method of manufacturing a semiconductor device according to the second embodiment to which the present invention is applied.
Figure 15:
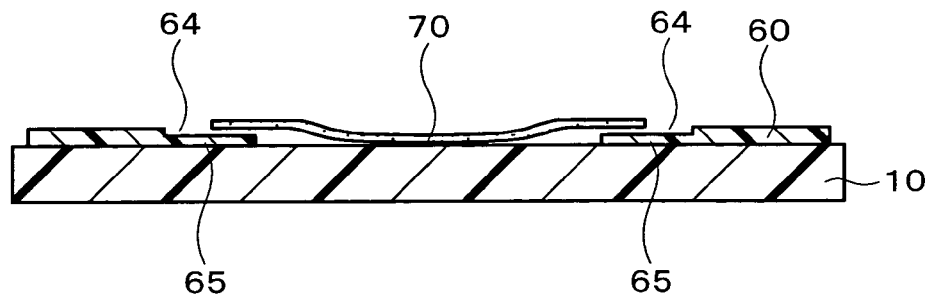
FIG. 15 is further illustrative of the method of manufacturing a semiconductor device according to the second embodiment to which the present invention is applied.

The method of manufacturing a semiconductor device according to this embodiment may include providing an adhesive 70 on the wiring board 10 as shown in FIGS. 14 and 15. FIG. 15 is a cross-sectional view along the line XV-XV shown in FIG. 14. The adhesive 70 is provided in the region 66 for providing an adhesive (see FIG. 10). As shown in FIG. 14, the adhesive 70 is provided to extend to the protective film 60 in the region around 62. In this embodiment, the adhesive 70 is provided in the form of a film. As described above, the protective film 60 includes the groove recess 64. The groove recess 64 is disposed to extend to the outside of the region 66 for providing an adhesive from the edge of the opening 62 in the protective film 60. Therefore, the space enclosed by the wiring board 10, the protective film 60, and the film-shaped adhesive 70 can be prevented from being closed. This enables air to be removed from the space enclosed by the wiring board 10, the protective film 60, and the film-shaped adhesive 70 through the groove recess 64 when mounting the semiconductor chip (see FIG. 15). Therefore, voids can be prevented from remaining between the semiconductor chip and the wiring board 10, whereby a highly reliable semiconductor device can be manufactured. As described above, the protective film 60 may be formed so that the bottom section 65 of the groove recess 64 is thinner than the interconnect pattern 12. This allows air to be easily removed from the space enclosed by the wiring board 10, the protective film 60, and the film-shaped adhesive 70. Therefore, a semiconductor device with higher reliability can be manufactured.

The method of manufacturing a semiconductor device according to the second embodiment to which the present invention is applied is not limited to the above description. For example, the groove recess 64 may be formed by a lithographic step. In more detail, the groove recess 64 may be formed by providing a precursor for the protective film 60 on the wiring board 10, and removing a part of the precursor by an exposure and development step. In this case, a photosensitive material is used as the precursor for the protective film 60. This also enables manufacture of a semiconductor device having the above-described effects.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A semiconductor device comprising:
   a wiring board which includes an interconnect pattern and
      a protective film, the protective film being disposed on the interconnect pattern and including a plurality of groove recesses, an opening being formed in the protective film and exposing a part of the interconnect pattern;

a semiconductor chip which includes a plurality of electrodes and is mounted on the wiring board so that the plurality of electrodes face the exposed part of the interconnect pattern; and a resin section disposed between the wiring board and the semiconductor chip to extend to the protective film in a region around the opening, wherein the plurality of groove recesses are formed around a perimeter of the opening except in a region which overlaps the interconnect pattern, the plurality of groove recesses being disposed to extend along the interconnect pattern from an edge of the opening in the protective film to outside of a region for providing the resin section, the plurality of groove recesses being formed so that a thickness of the protective film under a bottom section of the plurality of groove recesses is thinner than the interconnect pattern, and the bottom section of the plurality of groove recesses extends continuously in a straight line along the interconnect pattern from an edge of the opening in the protective film to outside of a region for providing the resin section.

2. A circuit board having the semiconductor device as defined in claim 1 mounted on a circuit board.

3. An electronic instrument having the semiconductor device as defined in claim 1.

* * * * *